(12) United States Patent
Kim et al.

(10) Patent No.: US 11,024,828 B2
(45) Date of Patent: Jun. 1, 2021

(54) FLEXIBLE DISPLAY DEVICE

(71) Applicant: SAMSUNG DISPLAY CO., LTD., Yongin-si (KR)

(72) Inventors: Jin Kyu Kim, Cheongju-si (KR); Mi-Ae Park, Hwaseong-si (KR); Sung Ku Kang, Suwon-si (KR); Sang Wol Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 44 days.

(21) Appl. No.: 15/446,875

(22) Filed: Mar. 1, 2017

(65) Prior Publication Data
US 2017/0352834 A1 Dec. 7, 2017

(30) Foreign Application Priority Data
Jun. 3, 2016 (KR) .................. 10-2016-0069466

(51) Int. Cl.
H01L 51/52 (2006.01)
G02F 1/1333 (2006.01)
(Continued)

(52) U.S. Cl.
CPC .... *H01L 51/5253* (2013.01); *G02F 1/133305* (2013.01); *H01L 27/3276* (2013.01);
(Continued)

(58) Field of Classification Search
CPC ............ H01L 51/5253; H01L 51/0097; H01L 27/3276; H01L 2224/73204; H01L 51/5271; H01L 51/5265; H01L 51/5203; H01L 27/3244; H01L 27/323; H01L 51/5293; H01L 2251/5338; H01L 23/60; H01L 27/3248; H01L 51/5256;
(Continued)

(56) References Cited

U.S. PATENT DOCUMENTS 9,209,414 B2  12/2015  Lim et al.
9,287,329 B1   3/2016  Lee et al.
(Continued)

FOREIGN PATENT DOCUMENTS

CN  104479611  4/2015
CN  104589744  5/2015
(Continued)

OTHER PUBLICATIONS

Extended European Search Report for Application No. 17174135.8 dated Nov. 10, 2017.

*Primary Examiner* — Moin M Rahman
(74) *Attorney, Agent, or Firm* — F. Chau & Associates, LLC

(57) ABSTRACT

A display device includes a flexible substrate including a display area and a non-display area. The substrate has a first surface and a second surface opposite to the first surface. A first protection film is disposed on the first surface of the substrate. The first protection film is disposed over the display area of the substrate. A second protection film is disposed on the first surface of the substrate. The second protection film is disposed over the non-display area of the substrate. A light transmittance of the first protection film is higher than that of the second protection film.

25 Claims, 15 Drawing Sheets

(51) Int. Cl.
   *H01L 27/32* (2006.01)
   *H01L 51/00* (2006.01)
   *G02F 1/1345* (2006.01)
   *G02F 1/1362* (2006.01)

(52) U.S. Cl.
   CPC ...... *H01L 51/0097* (2013.01); *G02F 1/13452* (2013.01); *G02F 2001/133388* (2013.01); *G02F 2001/136254* (2013.01); *G02F 2201/50* (2013.01); *G02F 2202/28* (2013.01); *H01L 2224/73204* (2013.01); *Y02E 10/549* (2013.01)

(58) Field of Classification Search
   CPC ............. H01L 51/5281; H01L 51/5284; H01L 51/5262; H01L 51/50–56; H01L 27/3246; H01L 27/3237; H01L 51/0032–0095; H01L 27/32–3297; H01L 2251/50–568; H01L 51/0579; H01L 27/344–3279; H01L 27/1214–1296; H01L 51/5209; H01L 27/3262; H01L 27/3258; H01L 27/322; H01L 51/5225; H01L 51/5268; H01L 2251/558; H01L 2251/303; H01L 2251/306; H01L 2251/308; H01L 51/5218; H01L 51/5275; H01L 51/0005; H01L 51/5012; H01L 51/5206; H01L 51/5221; H01L 51/56; H01L 2227/323; H01L 27/1255; H01L 27/124; H01L 51/52; G02F 1/133305; G02F 2202/28; G02F 1/13452; G02F 2201/50; G02F 2001/133388; G02F 2001/136254; Y02E 10/549; Y02P 70/50; G09F 9/00; H05B 33/10
   See application file for complete search history.

(56) References Cited

U.S. PATENT DOCUMENTS

| | | | |
|---|---|---|---|
| 9,570,524 B2 | 2/2017 | Lee et al. | |
| 9,748,315 B2 | 8/2017 | Kim | |
| 9,760,125 B2 | 9/2017 | Kim et al. | |
| 10,306,766 B2 | 5/2019 | Shi | |
| 2009/0072226 A1* | 3/2009 | Koo | H01L 27/3246 257/40 |
| 2011/0163456 A1* | 7/2011 | Miyasaka | H01L 21/6835 257/773 |
| 2011/0195240 A1* | 8/2011 | Inenaga | B32B 7/02 428/215 |
| 2013/0193832 A1* | 8/2013 | Jung | G02B 5/3083 313/112 |
| 2014/0042406 A1 | 2/2014 | Degner et al. | |
| 2014/0134763 A1* | 5/2014 | Park | H01L 51/0014 438/26 |
| 2014/0159043 A1* | 6/2014 | Sakariya | H01L 27/124 257/59 |
| 2014/0183473 A1* | 7/2014 | Lee | H01L 51/0097 257/40 |
| 2014/0374704 A1* | 12/2014 | Jang | H01L 51/0097 257/40 |
| 2015/0049281 A1* | 2/2015 | Lee | H01L 51/5253 349/69 |
| 2015/0212548 A1 | 7/2015 | Namkung et al. | |
| 2015/0301407 A1* | 10/2015 | Chan | G02F 1/133603 349/64 |
| 2015/0357395 A1* | 12/2015 | Cheon | H01L 27/3276 257/40 |
| 2016/0035800 A1* | 2/2016 | Hsieh | H01L 51/5253 257/40 |
| 2016/0043153 A1 | 2/2016 | Min | |
| 2016/0155788 A1 | 6/2016 | Kwon et al. | |
| 2016/0357052 A1* | 12/2016 | Kim | H01L 51/5237 |
| 2017/0054106 A1* | 2/2017 | Jeon | H01L 51/5253 |
| 2017/0110686 A1* | 4/2017 | Kamiya | H01L 27/322 |
| 2017/0170206 A1* | 6/2017 | Lee | H01L 27/1218 |

FOREIGN PATENT DOCUMENTS

| | | |
|---|---|---|
| CN | 20488440 | 12/2015 |
| CN | 105321978 | 2/2016 |
| CN | 105390523 | 3/2016 |
| JP | 2016031499 | 3/2016 |
| KR | 10-2014-0085956 | 7/2014 |
| KR | 10-2015-0036443 | 7/2014 |
| KR | 10-1385458 | 4/2017 |
| TW | 201440582 | 10/2014 |
| TW | 201521198 | 6/2015 |

* cited by examiner

FLEXIBLE DISPLAY DEVICE

CROSS-REFERENCE TO RELATED APPLICATION

This application claims priority to and the benefit of Korean Patent Application No. 10-2016-0069466, filed in the Korean Intellectual Property Office on Jun. 3, 2016, the entire contents of which are incorporated by reference herein.

TECHNICAL FIELD

The disclosure relates to a display device, and more particularly, to a flexible display device.

DISCUSSION OF THE RELATED ART

Display devices such as an organic light emitting diode (OLED) display and a liquid crystal display (LCD) are manufactured by disposing a plurality of layers and elements on a substrate. Glass is often used for the substrate of the display device. However, glass substrates may be heavy and easily broken. Further, glass substrates are rigid so it is difficult to bend the display device that has a glass substrate. Recently, display devices have been developed using flexible substrates that are light weight, strong, and flexible.

The display device using a flexible substrate may be manufactured so as to bend at an edge were a pad portion is located, thereby reducing dead space as compared to the display device using a rigid substrate. When the dead space is reduced, a bezel width of the display device may be reduced.

SUMMARY

A display device includes a flexible substrate including a display area and a non-display area. The substrate has a first surface and a second surface opposite to the first surface. A first protection film is disposed on the first surface of the substrate. The first protection film is disposed over the display area of the substrate. A second protection film is disposed on the first surface of the substrate. The second protection film is disposed over the non-display area of the substrate. A light transmittance of the first protection film is higher than that of the second protection film.

A display device includes a substrate including a first region, a second region, and a bending area disposed between the first region and the second region. A first protection film is disposed on the first region of the substrate. A second protection film is disposed on the second region of the substrate. The substrate is bent in the bending area, and the first protection film and the second protection film are disposed on either side of the bending area. A driving integrated circuit chip is disposed on the first region of the substrate. A tensile modulus of the first protection film is larger than that of the second protection film.

A display device includes a substrate including a display area and a non-display area. A first protection film is disposed in the display area of the substrate. A second protection film is disposed in the non-display area of the substrate. A first adhesive layer is disposed between the first protection film and the substrate. A second adhesive layer is disposed between the second protection film and the substrate. The first adhesive layer and the second adhesive layer have different storage modulus.

A display device includes a flexible substrate, wiring disposed on a top surface of the flexible substrate, and a protection film disposed on a bottom surface of the flexible substrate. The protection film includes a first section and a second section that are spaced apart from each other by a gap. The first section of the protection film is more transparent than the second section of the protection film, and the first protection film has a greater tensile modulus than the second protection film.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE EMBODIMENTS

The disclosure will be described more fully hereinafter with reference to the accompanying drawings, in which exemplary embodiments of the invention are shown. As those skilled in the art would realize, the described embodiments may be modified in various different ways, all without departing from the spirit or scope of the disclosure.

To clearly describe the disclosure, some elements may be omitted from the figures and description, and like numerals may refer to like or similar constituent elements throughout the specification and figures.

Further, the sizes and thicknesses of constituent members shown in the accompanying drawings may be exaggerated for clarity, better understanding, and ease of description. The disclosure is not limited to the illustrated sizes and thicknesses.

Figure 1:
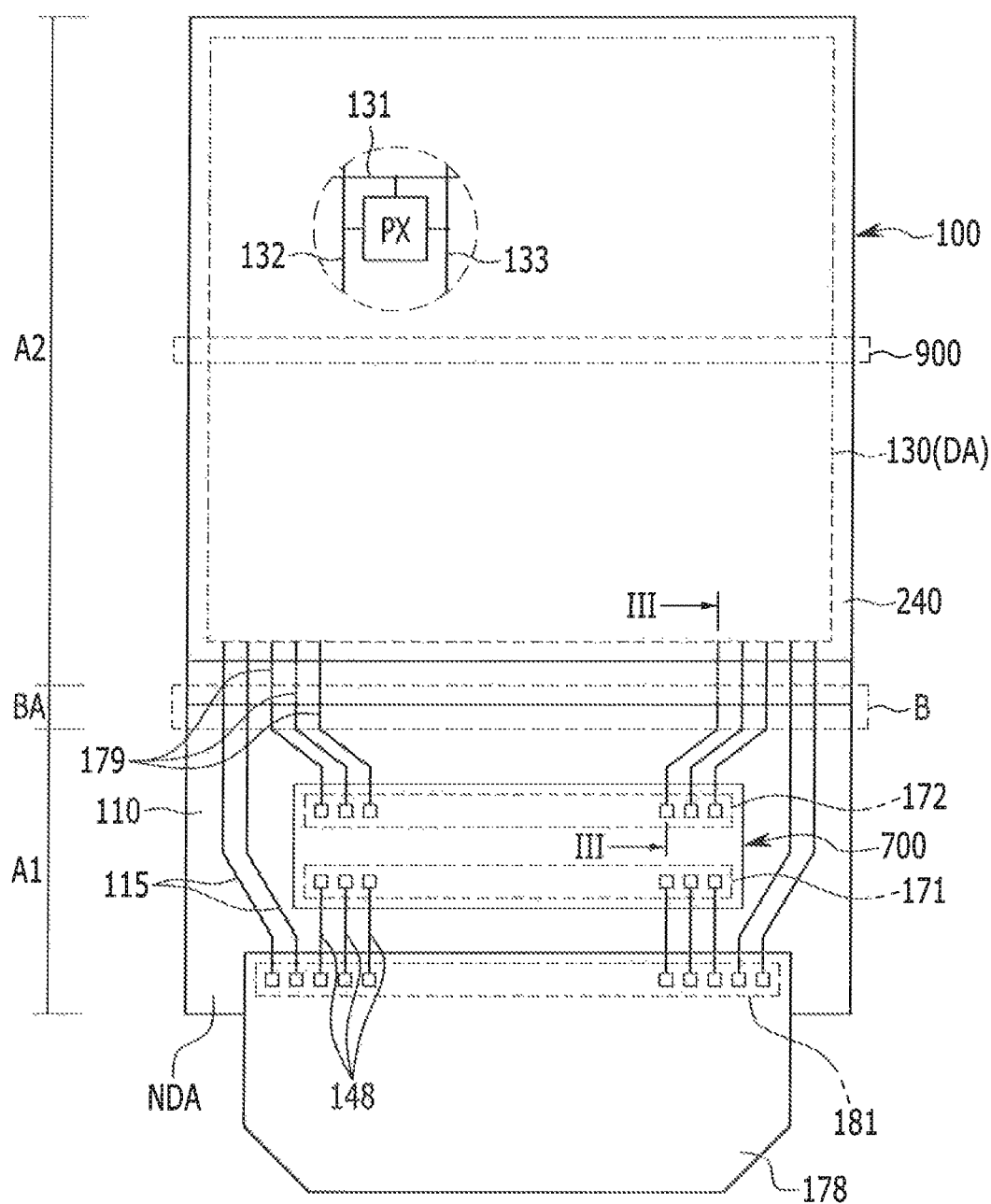
FIG. 1 is a schematic layout view illustrating a display device according to an exemplary embodiment of the present disclosure.
Figure 2:
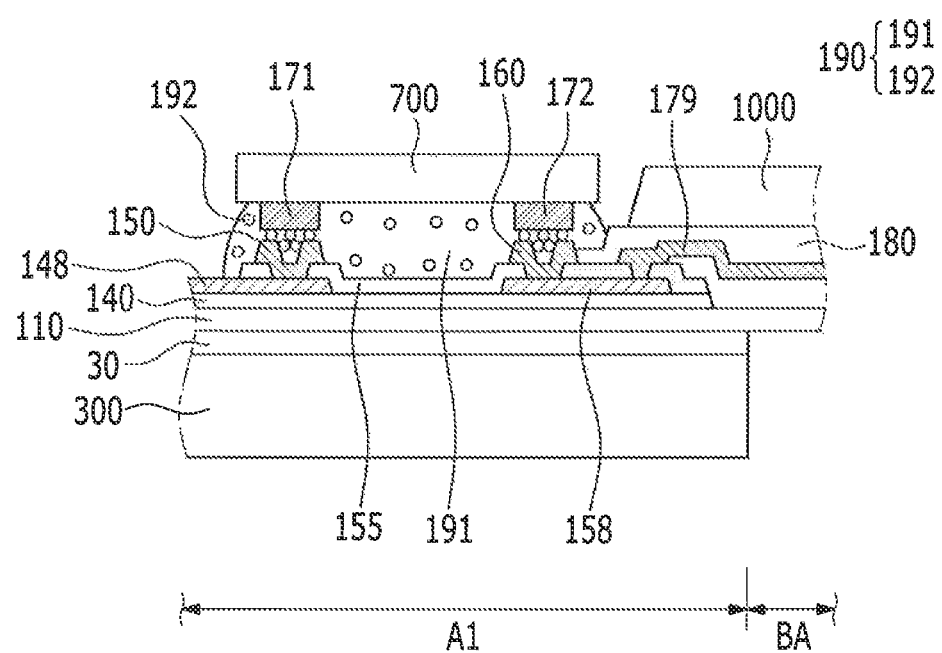
FIG. 2 is a cross-sectional view illustrating a driving integrated circuit chip of FIG. 1.
Figure 3:
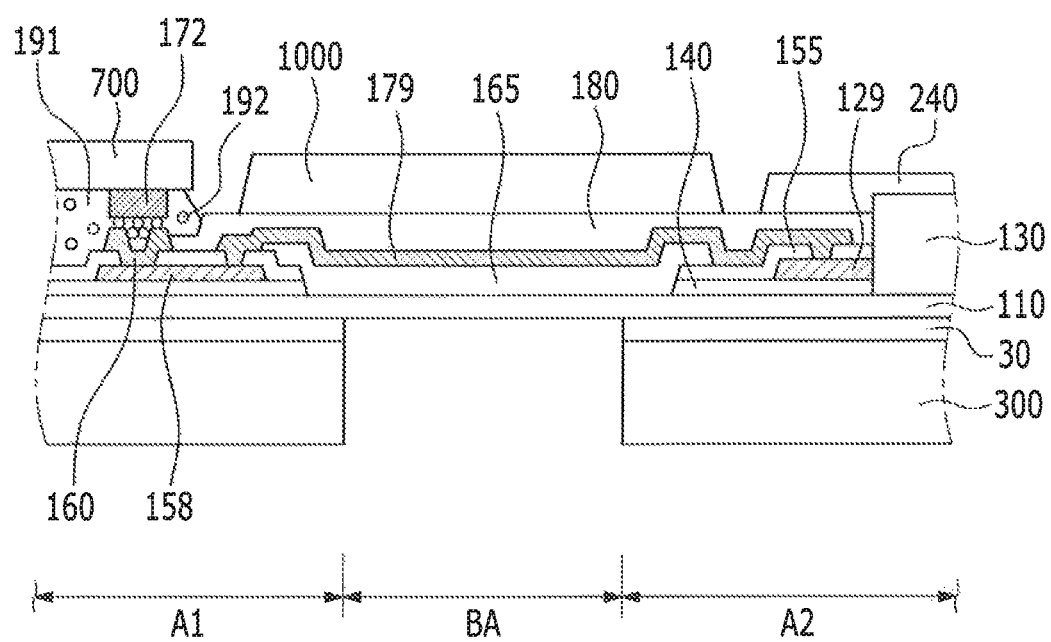
FIG. 3 is a cross-sectional view taken along a line III-III of FIG. 1.

Further, it will be understood that when an element such as a layer, film, region, or substrate is referred to as being "on" another element, it can be directly on the other element or intervening elements may also be present. FIG. 1 is a schematic layout view illustrating a display device according to an exemplary embodiment of the present disclosure. FIG. 2 is a cross-sectional view illustrating a driving integrated circuit chip of FIG. 1. FIG. 3 is a cross-sectional view taken along a line 111411 of FIG. 1.

Referring to FIG. 1 to FIG. 3, the display device 10 includes a display panel 100, a driving integrated circuit chip 700 mounted in the display panel 100, and a printed circuit board (PCB) 178 coupled to the display panel 100. The display device 10 may be an organic light emitting diode (OEM) display, a liquid crystal display (LCD), or an electrophoretic display. An example in which the display device 10 is the OLED display will be described hereinafter.

The display panel 100 includes a substrate 110, a display unit 130 disposed on the substrate 110, and an encapsulation layer 240 configured to encapsulate the display unit 130. The substrate 110 may be a flexible substrate. In this case, the display panel 100 may be bent, folded, or rolled.

The substrate 110 may include polyimide, polyamide, and/or polyethylene terephthalate. However, the material of the substrate 110 is not limited thereto. For example, a flexible polymer material may be used to form the substrate 110.

The substrate 110 includes a display area DA in which the display unit 130 is formed and a non-display area NDA disposed outside of the display area DA. The non-display area NDA may be formed to surround the display area DA along an edge of the display area DA.

Referring to FIG. 1 and FIG. 3, the substrate 110 may also include a first region A1 in which the driving integrated circuit chip 700 is formed, a second region A2 including the display area DA, and a bending area BA disposed between the first region A1 and the second region A2. In the bending area BA, an axis at which an edge of the display panel 100 is bendable is positioned, and a bending portion B at which a first wire unit 179 is formed. In the second region A2, which is adjacent to the bending portion B, a contact structure in which a first wire unit extended from the bending portion B electrically contacts a signal line extended from the display unit 130 is formed.

The display unit 130 includes a plurality of pixels PX, and images are displayed by using combinations of light emitted from the pixels PX. In the display unit 130, a plurality of signal lines including a plurality of gate lines 131, a plurality of data lines 132, and a plurality of driving voltage lines 133 are formed. Each of the pixels PX includes a pixel circuit connected to the signal lines and an OLED for emitting light under control of the pixel circuit.

The OLED may be vulnerable to moisture and oxygen, and thus the encapsulation layer 240 seals the display unit 130 to block inflow of moisture and oxygen. The encapsulation layer 240 may be formed of an encapsulation substrate that is bonded to the substrate 110 by a sealant, or may be formed for thin film encapsulation in which a plurality of layers, such as composite layers of inorganic layers, composite layers of organic layers, or composite layers of inorganic layers, and organic layers are stacked. The organic layers may include, for example, hexamethyldisiloxane.

The driving integrated circuit chip 700 is mounted in the non-display area NDA of the substrate 110. The driving integrated circuit chip 700 may be a source driving integrated circuit which applies a data voltage to the display unit 130, a gate driving integrated circuit which applies a gate voltage to the display unit 130, or a combined driving integrated circuit chip in which both a source driver and a gate driver are integrated. One driving integrated circuit chip 700 is illustrated in FIG. 1, but the number of driving integrated circuit chips 700 is not limited thereto.

Referring to FIG. 2, the driving integrated circuit chip 700 includes an input bump unit 171 for receiving a signal from the printed circuit board (PCB) 178 and an output bump unit 172 for transmitting a signal to the display unit 130. The input bump unit 171 includes a plurality of input bumps that are arranged at regular intervals from a side of the driving integrated circuit chip 700 facing the printed circuit board 178. The output bump unit 172 includes a plurality of output bumps that are arranged at regular intervals from a side of the driving integrated circuit chip 700 facing the display unit 130.

In the non-display area NDA of the substrate 110, a first input pad layer 148 is disposed on a gate insulating layer 140, an interlayer insulating layer 155 is disposed on the first input pad layer 148, and a second input pad layer 150 is disposed to contact the first input pad layer 148 through a contact hole formed in the interlayer insulating layer 155.

In the non-display area NDA of the substrate 110, the first input pad layer 148 and the second input pad layer 150 electrically connect an output pad unit 181 of the printed circuit board (PCB) 178 with the input bump unit 171 of the driving integrated circuit chip 700. Further, in the non-display area NDA of the substrate 110, a first output pad layer 158 and a second output pad layer 160 are formed to electrically connect the output bump unit 172 of the driving integrated circuit chip 700 with the display unit 130.

The gate insulating layer 140 may be generated by stacking inorganic insulating materials such as a silicon oxide or a silicon nitride. The gate insulating layer 140 might not be disposed in the bending area BA. The interlayer insulating layer 155 may include an organic material. The interlayer insulating layer 155 might not be disposed in the bending area BA.

The driving integrated circuit chip 700 may be mounted on the substrate 110 by using a chip-on-plastic method. For example, the driving integrated circuit chip 700 may be mounted on the substrate 110 by disposing an anisotropic conductive film (ACF) 190 on the second input pad layer 150 and the second output pad layer 160, disposing the driving integrated circuit chip 700 on the anisotropic conductive film 190, and compressing the driving integrated circuit chip 700 at a high temperature.

The anisotropic conductive film 190 includes an adhesive resin 191 and a plurality of conductive particles 192 dispersed within the adhesive resin 191. When the driving integrated circuit chip 700 is compressed to the substrate 110 with the anisotropic conductive film 190 therebetween, the input bump unit 171 is electrically connected with the second input pad layer 150 by the conductive particles 192 between the input bump unit 171 and the second input pad layer 150. Further, the output bump unit 172 is electrically connected with the second output pad layer 160 by the conductive particles 192 between the output bump unit 172 and the second output pad layer 160.

The printed circuit board 178 may be a flexible printed circuit (FPC), and in this case, dead space formed outside of the display unit 130 may be minimized by folding the flexible printed circuit toward the substrate 110.

The printed circuit board 178 provides power, control signals, and the like, for controlling the driving integrated circuit chip 700. The driving integrated circuit chip 700 outputs signals for driving the display unit 130. The power of the printed circuit board (PCB) 178 may be directly transferred to the display unit 130 through a bypass wire 115, without first passing through the driving integrated circuit chip 700.

In the bending area BA of the substrate 110, the first wire unit 179 is connected with the first output pad layer 158 of the non-display area NDA. The first wire unit 179 extended to cross the bending area BA is connected with a second wire unit 129 formed in the second region A2.

Each of the second input pad layer 150 and the second output pad layer 160 may be formed of a metal material. This metal material may be the same as that of one of a plurality of electrodes formed in the display unit 130, and each of the second input pad layer 150 and the second output pad layer 160 may be formed together with the electrodes. For example, each of the second input pad layer 150 and the second output pad layer 160 may include a metal such as copper (Cu), aluminum (Al), silver (Ag), molybdenum (Mo), chromium (Cr), gold (Au), platinum (Pt), palladium (Pd), tantalum (Ta), tungsten (W), titanium (Ti), and/or nickel (Ni), and/or a metal alloy thereof. Each of the second input pad layer 150 and the second output pad layer 160 may be made of an aluminum-based metal such as aluminum or an aluminum alloy having a small modulus. In this case, since the second wire portion 179 disposed in the bending area BA has low stress on a strain, the danger of short-circuit or degradation of the first wire unit 179 in the case of bending of the display device 10 may be reduced.

In the bending area BA, a first passivation layer 165 may be disposed between the substrate 110 and the first wire unit 179. The first passivation layer 165 may include an organic material.

In the bending area BA, the first wire unit 179 may be disposed between the first passivation layer 165 and the second passivation layer 180, and the first wire unit 179 may be prevented from being damaged by the first passivation layer 165 and the second passivation layer 180 when the display device is bent. The first and second passivation layers 165 and 180 might not be disposed within the first region A1, or only small portions thereof might be disposed within the first region A1.

A neutral plane adjusting member 1000 may be disposed in the bending area BA to reduce stress and protect the first wire unit 179. The neutral plane adjusting member 1000 may be formed by curing an acryl resin in such a way so as to cover the first wire unit 179 of the bending area BA.

A protection film 300 may be disposed below the substrate 110. The protection film 300 is attached in the substrate 110 by using an adhesive layer 30 that is formed of a pressure sensitive adhesive (PSA) or an optically clear adhesive (OCA). The protection film 300 may be formed of a polymer film including polyethylene terephthalate (PET), polycarbonate (PC), polymethyl methacrylate (PMMA), polyethylene naphthalate (PEN), polyimide (PI), polyethylene sulfide (PES), polyamide (PA), and/or aramid. To accomplish a small curvature radius, as shown in FIG. 3, the protection film 300 may have a separated space, or gap, at a portion that is overlapped with the bending area BA.

In FIG. 3, the separated space of the protection film 300 is shown to serve as the bending area BA. However, the separated space need not exactly coincide with the bending area. For example, the bending area BA may include a portion having a curvature, and as shown in FIG. 3, a first interface between the first region A1 and the bending area BA and a second interface between the bending area BA and the second region A2 may be independently moved left or right. For example, the first interface between the first region A1 and the bending area BA may be moved to overlap a left portion of the protection film 300 based on the separated space thereof or the separated space of the protection film 300, and the second interface between the bending area BA and the second region A2 may be moved to overlap a right portion of the protection film 300 based on the separated space thereof or the separated space of the protection film 300.

In the present exemplary embodiment, the substrate 110 further includes a folding portion 900 formed to cross the display area DA. The folding portion 900 may include a folding axis along which the display panel 100 may be bent or folded.

In a display device according to an exemplary embodiment of the disclosure, the protection film 300 may have different regions that are formed of different materials.

Hereinafter, a protection film according to an exemplary embodiment of the disclosure will be described with reference to FIG. 4.

Figure 4:
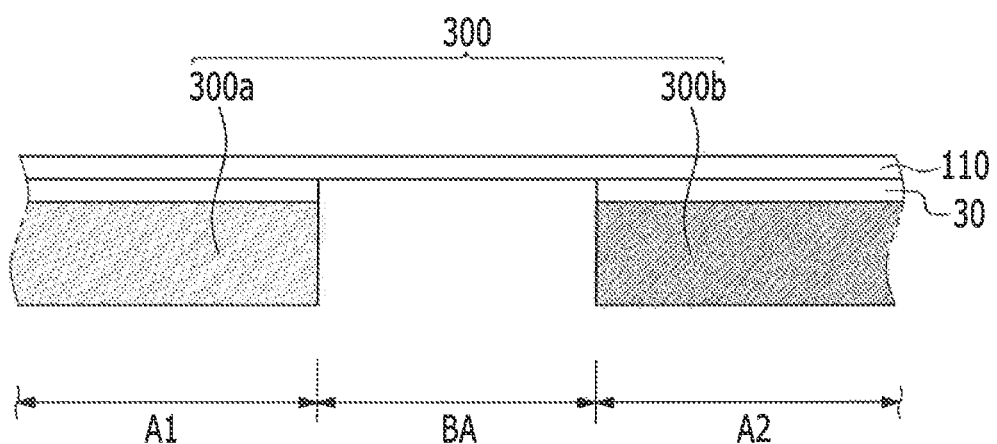
FIG. 4 is a cross-sectional view partially illustrating a structure of FIG. 3.

FIG. 4 is a cross-sectional view partially illustrating a structure of FIG. 3.

Referring to FIG. 4, the protection film 300, according to the present exemplary embodiment, includes a first protection film 300a and a second protection film 300b that are separately disposed, for example, with a space or gap therebetween. The first protection film 300a and the second protection film 300b may be disposed below the substrate 110, and may be attached on the substrate 110 by using the adhesive layer 30.

The first protection film 300a is disposed to correspond to the first region A1, and the second protection film 300b is disposed to correspond to the second region A2. As described above with reference to FIG. 1, the driving integrated circuit chip 700 is formed in the first region A1, the second region A2 includes the display area DA, and the bending area BA is positioned therebetween.

The first and second protection films 300a and 300b may be separately disposed based on the bending area BA.

The first protection film 300a includes polyethylene terephthalate (PET), polycarbonate (PC), and/or polymethyl methacrylate (PMMA), and the second protection film 300b includes polyethylene naphthalate (PEN), polyimide (PI), polyethylene sulfide (PES), polyamide (PA), and/or aramid. For example, the first protection film 300a may include polyethylene terephthalate (PET), and the second protection film 300b may include polyimide (PI).

In the present exemplary embodiment, transmittance of light of the first protection film 300a may be higher than that of the second protection film 300b. For example, the first protection film 300a may have light transmittance of about 80% or more, and the second protection film 300b may have light transmittance of about 60% or less.

A color of the first protection film 300a may be different from that of the second protection film 300b. For example, the first protection film 300a may be transparent, while the second protection film 300b may be nearly transparent with a sight yellow tint.

A tensile modulus of the first protection film 300a may be in a range of 3 GPa to 15 GPa, and a tensile modulus of the second protection film 300b may be in a range of 2 GPa to 10 GPa. In this case, the tensile modulus of the first protection film 300a may be greater than that of the second protection film 300b. This is because the first protection film 300a having a higher tensile modulus makes it possible to prevent occurrence of a wire crack caused by a pressure in an operation in which the driving integrated circuit chip 700 is mounted in the substrate 110.

In the present exemplary embodiment, a glass transition temperature Tg of the first protection film 300a may be 100° C. or less, and a glass transition temperature Tg of the second protection film 300b may be 150° C. or more.

As described above, in the first region A1 in which the first protection film 300a is formed, the driving integrated circuit chip 700 of FIG. 3 is formed by being compressed to the substrate 110 by high-pressure bonding. The light transmittance of the protection film is about 80% or more in order to permit visual examination of a mounting state of the driving integrated circuit chip 700 in the substrate 110, after the driving integrated circuit chip 700 is formed.

The second region A2 in which the second protection film 300b is formed includes the folding portion 900 of FIG. 3. When the display panel 100 is bent or folded at the folding portion 900, there is a risk that a protection film formed of a polymer material such as polyethylene terephthalate may deteriorate and a neutral plane might not be maintained and the display panel 100 may break in a temperature environment of 60 to 85° C. as the display panel 100 is bent or folded.

Polyethylene terephthalate leas a glass transition temperature Tg of about 78° C. Accordingly, when the display panel 100 is bent or folded, a protection film formed of a polymer material such as polyethylene terephthalate may fail.

Accordingly, exemplary embodiments of the present invention may utilize a first protection film 300a that has relatively high light transmittance in the first region A1 in which the driving integrated circuit chip 700 is disposed and the second protection film 300b having relatively low light transmittance, but a relatively high glass transition temperature Tg, in the second region A2 including the display area DA in which the folding portion 900 is formed.

Each of the first protection film 300a and the second protection film 300b may have a thickness that is in a range of about 5 μm to 250 μm. The first protection film 300a may be thicker than the second protection film 300b. The second protection film 300b may be thin enough to be folded at the folding portion 900 of FIG. 1, and the first protection film 300a may be sufficiently thick in consideration of the compression of the driving integrated circuit chip 700 of FIG. 2. However, too large a thickness difference between the first protection film 300a and the second protection film 300b increases a step between the first region A1 and the second region A2. Accordingly, it is possible to control the step by differently adjusting the thicknesses of the adhesive layers 30 that are respectively disposed in the first region A1 and the second region A2.

Figure 5:
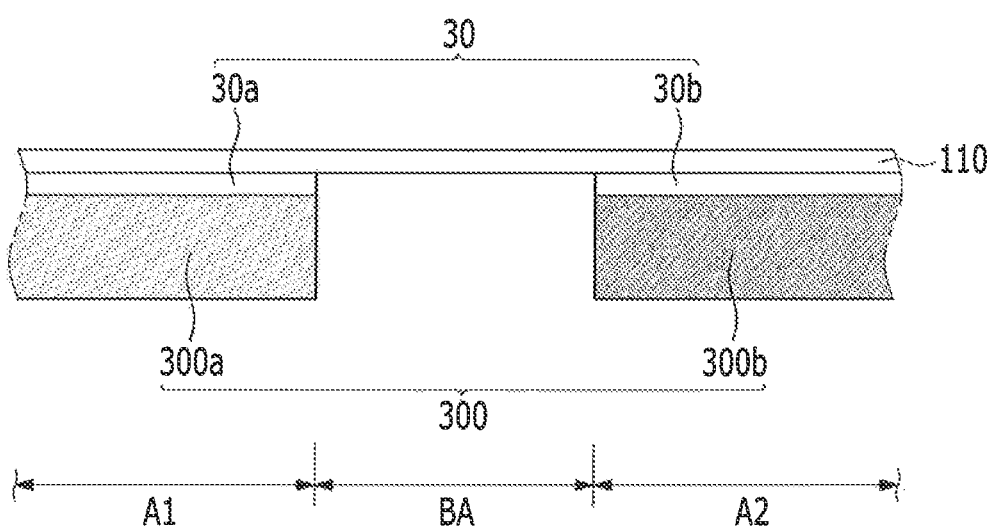
FIG. 5 is a cross-sectional view illustrating a modification of FIG. 4.

FIG. 5 is a cross-sectional view illustrating a modification of FIG. 4.

Referring to FIG. 5, a first adhesive layer 30a may be disposed between the substrate 110 and the first protection film 300a, a second adhesive layer 30b may be disposed between the substrate 110 and the second protection film 300b, and a physical property of the first adhesive layer 30a may be different from that of the second adhesive layer 30b. For example, the first adhesive layer 30a and the second adhesive layer 30b may have different adhesions, and the adhesion of the first adhesive layer 30a may be larger than that of the second adhesive layer 30b. The first adhesive layer 30a may have a glass adhesion of 1000 gf/inch or more, and the second adhesive layer 30b may have a glass adhesion of 200 gf/inch. Herein, the glass adhesion is obtained by measuring a force required to peel an adhesive layer attached on a substrate formed of glass.

In the present exemplary embodiment, the first adhesive layer 30a and the second adhesive layer 30b may have the same adhesion but may have different storage modulus. According to another approach, the first adhesive layer 30a and the second adhesive layer 30b may have different adhesions and may have different storage modulus.

In this case, the storage modulus of the first adhesive layer 30a may be larger than that of the second adhesive layer 30b. This is because the first adhesive layer 30a having a high storage modulus makes it possible to prevent occurrence of a wire crack caused by a pressure in an operation in which the driving integrated circuit chip 700 is mounted in the substrate 110.

Figure 6:
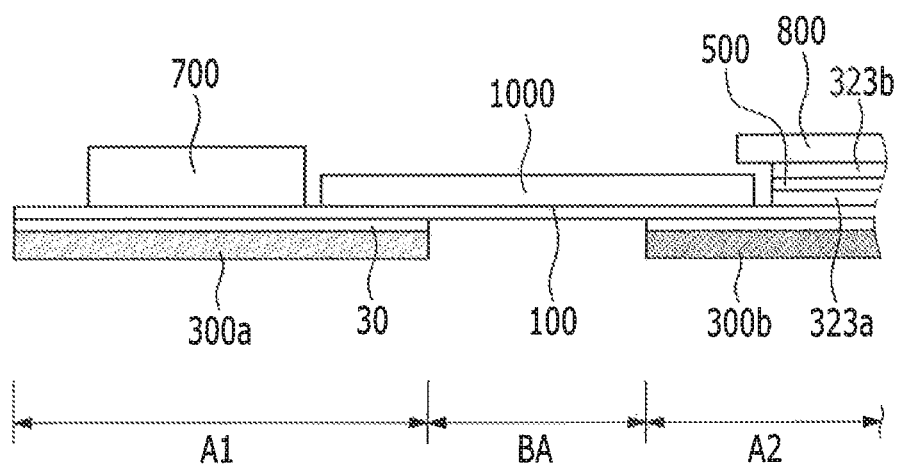
FIG. 6 is a schematic layout view illustrating a structure of a display device, prior to bending, according to an exemplary embodiment of the present disclosure.
Figure 7:
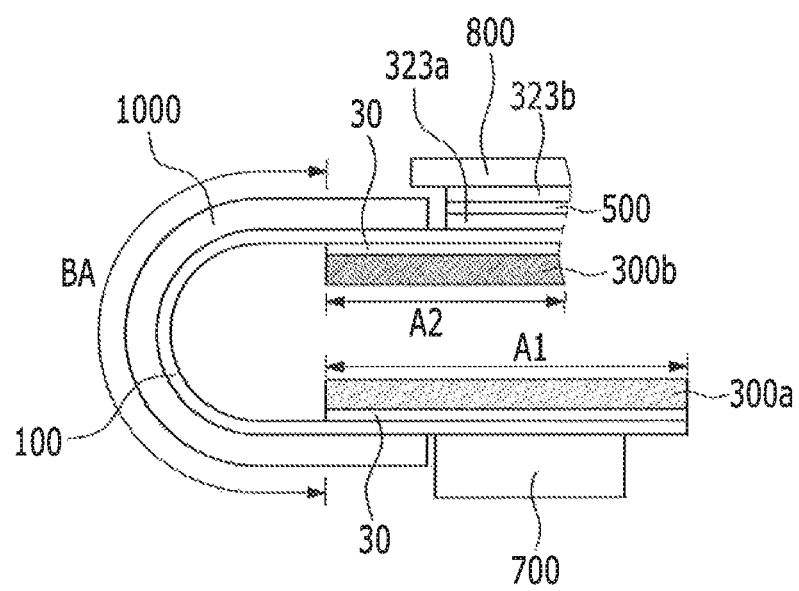
FIG. 7 is a schematic layout view illustrating a structure of the display device of FIG. 6, after bending, according to an exemplary embodiment of the present disclosure.

FIG. 6 schematically illustrates a structure of a display device according to an exemplary embodiment of the disclosure, in an un-bent state. FIG. 7 schematically illustrates a structure of the display device of FIG. 6, in a bent state.

Referring to FIG. 6, the first and second protection films 300a and 300b and the adhesive layer 30 are disposed in one surface of the display panel 100, and the driving integrated circuit chip 700, the neutral plane adjusting member 1000, and an optical film such as a polarization film 500, a window panel 800, a lower adhesive film 323a, and an upper adhesive film 323b are disposed in another surface of the display panel 100.

The polarization film 500 may be used to reduce reflection of external light from the outside, and the window panel 800 may serve to protect the display panel 100 from the outside and serve to transmit an image outputted from the display panel 100 to a user.

The window panel 800 may be formed of a transparent material such as glass, polyethylene terephthalate, or acryl, but this disclosure is not limited thereto. Although not shown, a touch panel may be formed below the window panel 800 to sense external contact.

In FIG. 7, it is illustrated that the neutral plane adjusting member 1000 is separated from the polarization film 500. However, according to an approach, the neutral plane adjusting member 1000 may contact the polarization film 500, or a part of an end portion of the neutral plane adjusting member 1000 may be overlapped with an upper portion of the polarization film 500. According to an approach, the polarization film 500 may be omitted by introducing an anti-reflective layer or an anti-reflective unit into the display panel 100.

Referring to FIG. 7, the display device of FIG. 6 may be bent in the bending area BA such that the driving integrated circuit chip 700 may be positioned to overlap the second region A2. When the display device is bent, stress may be generated in the first wire unit 179 of FIG. 1 positioned in the bending area BA. However, a crack is prevented from being generated in the first wire unit 179 by reducing the stress of the first wire unit 179 by the neutral plane adjusting member 1000 which covers the bending area BA. For example, when the display device is bent, the neutral plane adjusting member 1000 disposed on the substrate 110 may receive tensile stress to reduce the stress applied to the first wire unit 179 of FIG. 1.

FIG. 7 is a diagram illustrating a bent state of the display device, in which ends of the first protection film 300a and the second protection film 300b positioned at the same side are aligned. However, as described above, positions of the left and right interfaces of the bending area BA may be changed. Accordingly, ends of the first protection film 300a and the second protection film 300b positioned at the same side might not be aligned in a vertical direction based on a line-of-sight view of the drawing.

Figure 8:
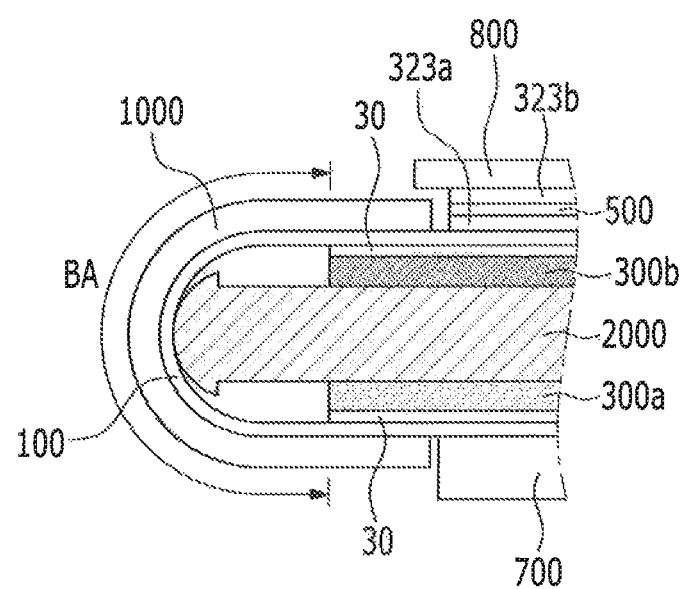
FIG. 8 is a diagram illustrating the display device of FIG. 7 to which a fixing member is added.

FIG. 8 is a diagram illustrating the display device of FIG. 7 to which a fixing member is added.

Referring to FIG. 8, a fixing member 2000 is disposed between the first protection film 300a and the second protection film 300. The fixing member 2000 serves to fix and support a bent shape of the display device to maintain the bent shape.

Figure 9:
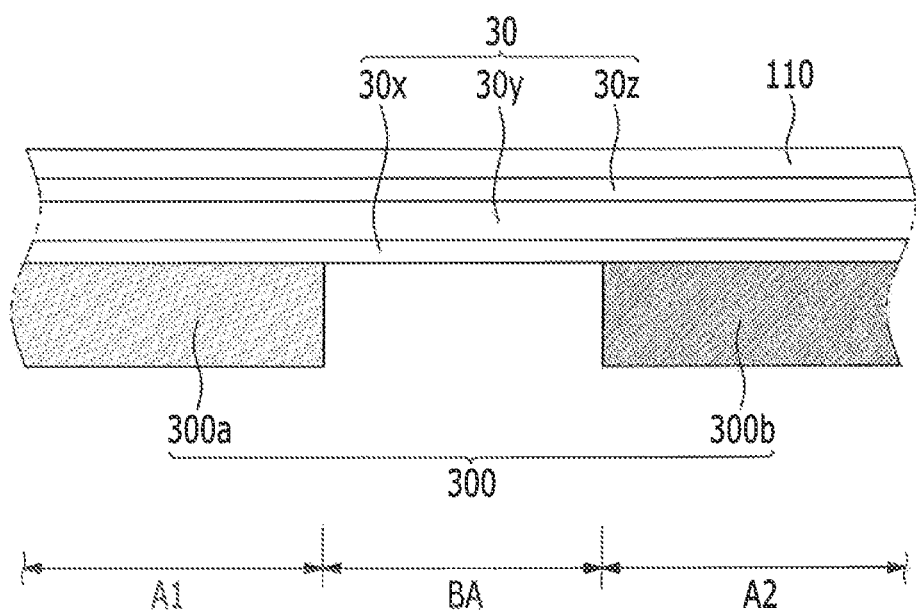
FIG. 9 is a diagram illustrating a modified version of the structure of FIG. 4, and is a cross-sectional view illustrating a structure of a multi-layered adhesive layer in accordance with an exemplary embodiment of the present disclosure.

FIG. 9 is a diagram illustrating a modified version of the structure of FIG. 4, and is a cross-sectional view illustrating a structure of a multi-layered adhesive layer in accordance with exemplary embodiments of the present invention.

Referring to FIG. 9, according to the present exemplary embodiment, the adhesive layer 30 includes a lower adhesive layer 30x, an upper adhesive layer 30z, and a cushion layer 30y disposed between the lower adhesive layer 30x and the upper adhesive layer 30z. The lower adhesive layer 30x contacts the first and second protection films 300a and 300b, and the upper adhesive layer 30z contacts the substrate 110.

The cushion layer 30y may serve as the neutral plane adjusting member 1000 described with reference to FIG. 7, and thus the neutral plane adjusting member 1000 disposed on the substrate 110 may be omitted.

The cushion layer 30y may be disposed below the substrate 110, and when the display device is bent, the cushion layer 30y may absorb compression stress to reduce stress applied to the first wire unit 179 of FIG. 1.

The cushion layer 30y includes polyethylene terephthalate (PET), polycarbonate (PC), polymethyl methacrylate (PMMA), polyethylene naphthalate (PEN), polyimide (PI), and/or polyethylene sulfide (PES).

Figure 10:
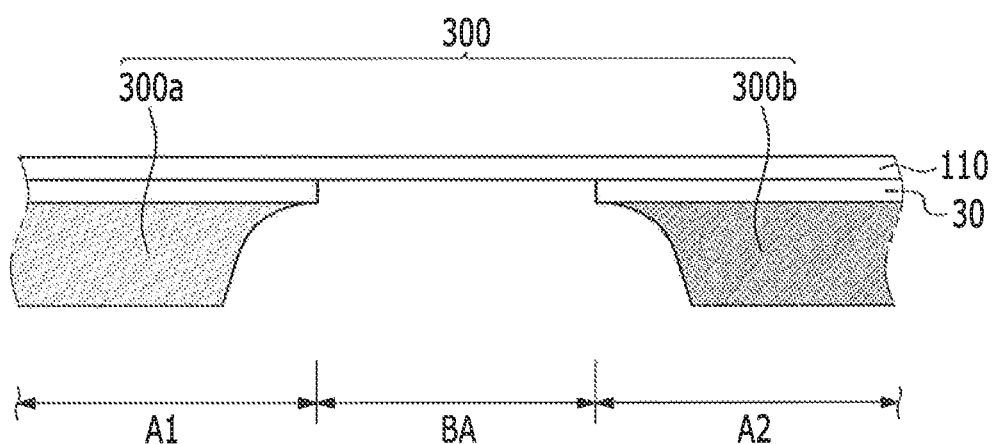
FIG. 10 is a diagram illustrating a modified version of the structure of FIG. 4, and is a cross-sectional view illustrating a structure in which a shape of an end portion of a protection film is changed in accordance with an exemplary embodiment of the present disclosure.

A thickness of the cushion layer 30y may be in a range of about 5 μm to 100 μm, FIG. 10 is a modification of FIG. 4, and is a cross-sectional view in which a shape of an end portion of a protection film is changed.

Referring to FIG. 10, at least one of end portions of the first protection film 300a and the second protection film 300b adjacent to the bending area BA may have an arc shapes structure, and FIG. 10 illustrates an exemplary embodiment in which both of the end portions of the first and second protection films 300a and 300b have the arc shaped structure.

One surface of the substrate 110 is exposed between the arc shaped structures of the first protection film 300a and the second protection film 300b. This arc shaped structure may serve as a starting point for bending the display device to facilitate precise bending in an initially desired direction.

Figure 11:
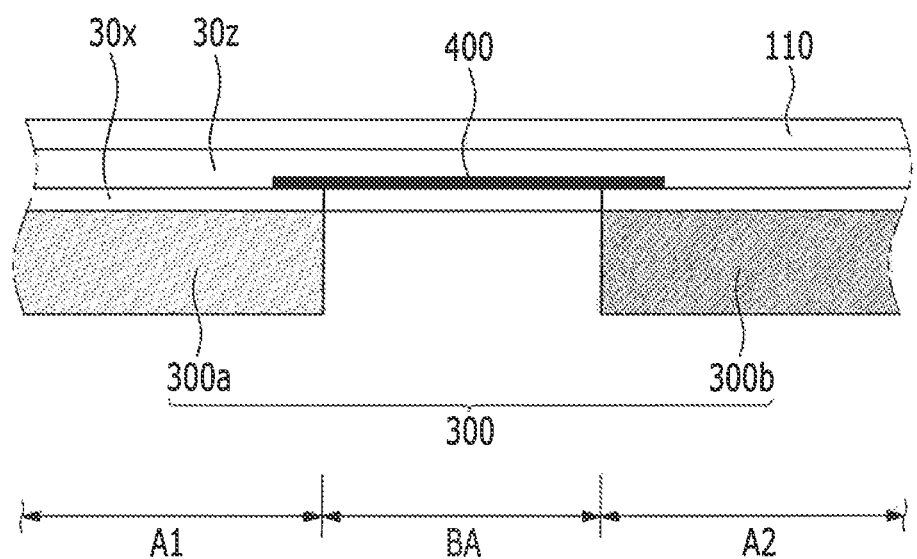
FIG. 11 is a diagram illustrating a modified version of the structure of FIG. 9, and is a cross-sectional view illustrating a supporting layer disposed inside an adhesive layer in accordance with an exemplary embodiment of the present disclosure.

FIG. 11 is a modification of FIG. 9, and is a cross-sectional view illustrating a supporting layer disposed inside an adhesive layer.

Referring to FIG. 11, a supporting member 400 is disposed between the lower adhesive layer 30x and the upper adhesive layer 30z. The supporting member 400 is disposed to occupy the bending area BA so as to overlap the neutral plane adjusting member 1000 of FIG. 6. The supporting member 400 includes polyethylene terephthalate polycarbonate (PC), polymethyl methacrylate (PMMA), polyamide (PA), polyethylene sulfide (PES), polyimide (PI), stainless steel, and/or Invar as a material having a high modulus.

When the display device is bent in a state in which the neutral plane adjusting member 1000 is non-uniformly coated on the substrate 110, a wire crack may occur. However, as in the present exemplary embodiment, when the supporting member 400 is disposed to overlap the neutral plane adjusting member 1000, the neutral plane may be maintained to be disposed at the wires.

Figure 12:
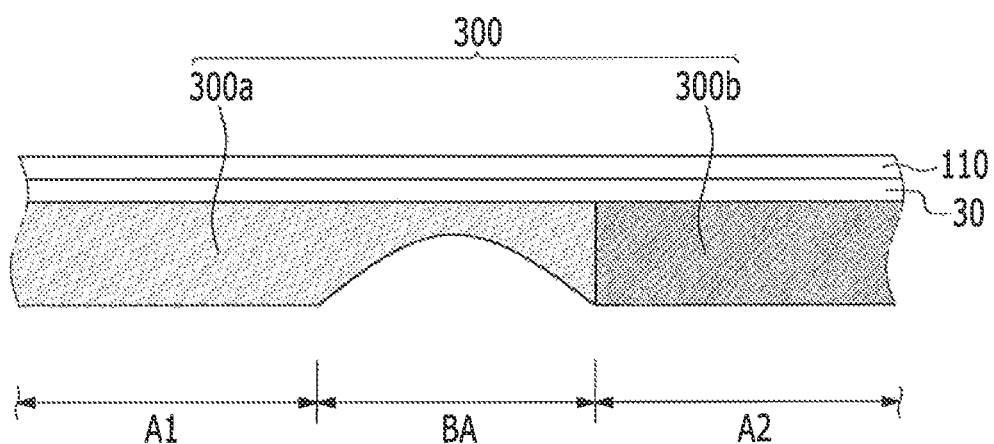
FIG. 12 is a cross-sectional view illustrating a shape of a protection film corresponding to a bending area in a display device according to an exemplary embodiment of the present disclosure.

FIG. 12 is a cross-sectional view illustrating a shape of a protection film corresponding to a bending area in a display device according to an exemplary embodiment of the disclosure.

Referring to FIG. 12, the first protection film 300a in the first region A1 may be extended to the bending area BA, and the first protection film 300a in the bending area BA is patterned such that a thickness thereof may be thinner than that of the first protection film 300a in the first region A1. A pattern of the first protection film 300a in the bending area BA may have a shape such as a substantially circular or quadrangular shape.

According to the present exemplary embodiment, the patterned portion of the first protection film 300a may serve as a starting point for bending the display device to facilitate precise bending in an initially desired direction.

Figure 13:
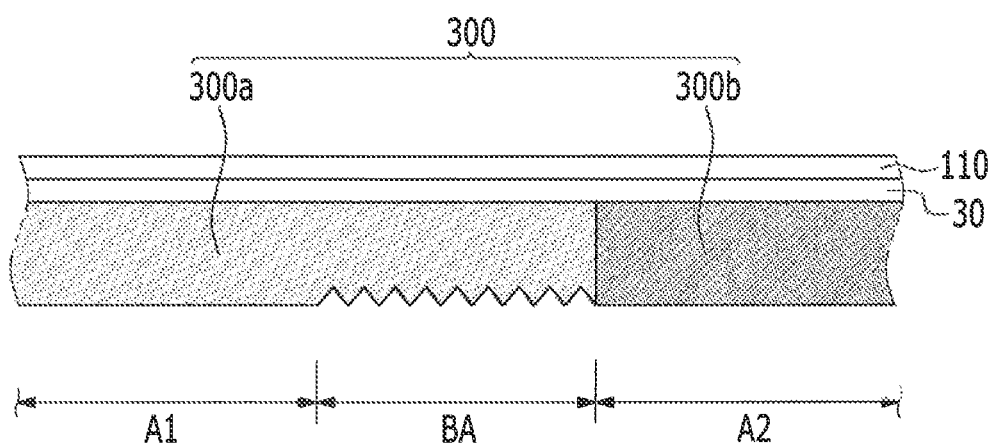
FIG. 13 is a diagram illustrating a modified version of the structure of FIG. 12, and is a cross-sectional view illustrating an uneven structure of a protection film corresponding to a bending area in accordance with an exemplary embodiment of the present disclosure.

FIG. 13 is a modification of FIG. 12, and is a cross-sectional view illustrating an uneven structure of a protection film corresponding to a bending area.

Referring to FIG. 13, the first protection film 300a in the first region A1 may be extended to the bending area BA, and one surface of the first protection film 300a in the bending area BA has an uneven structure. This uneven structure may also serve as a start point for bending the display device to facilitate precise bending in an initially desired direction.

Figure 14:
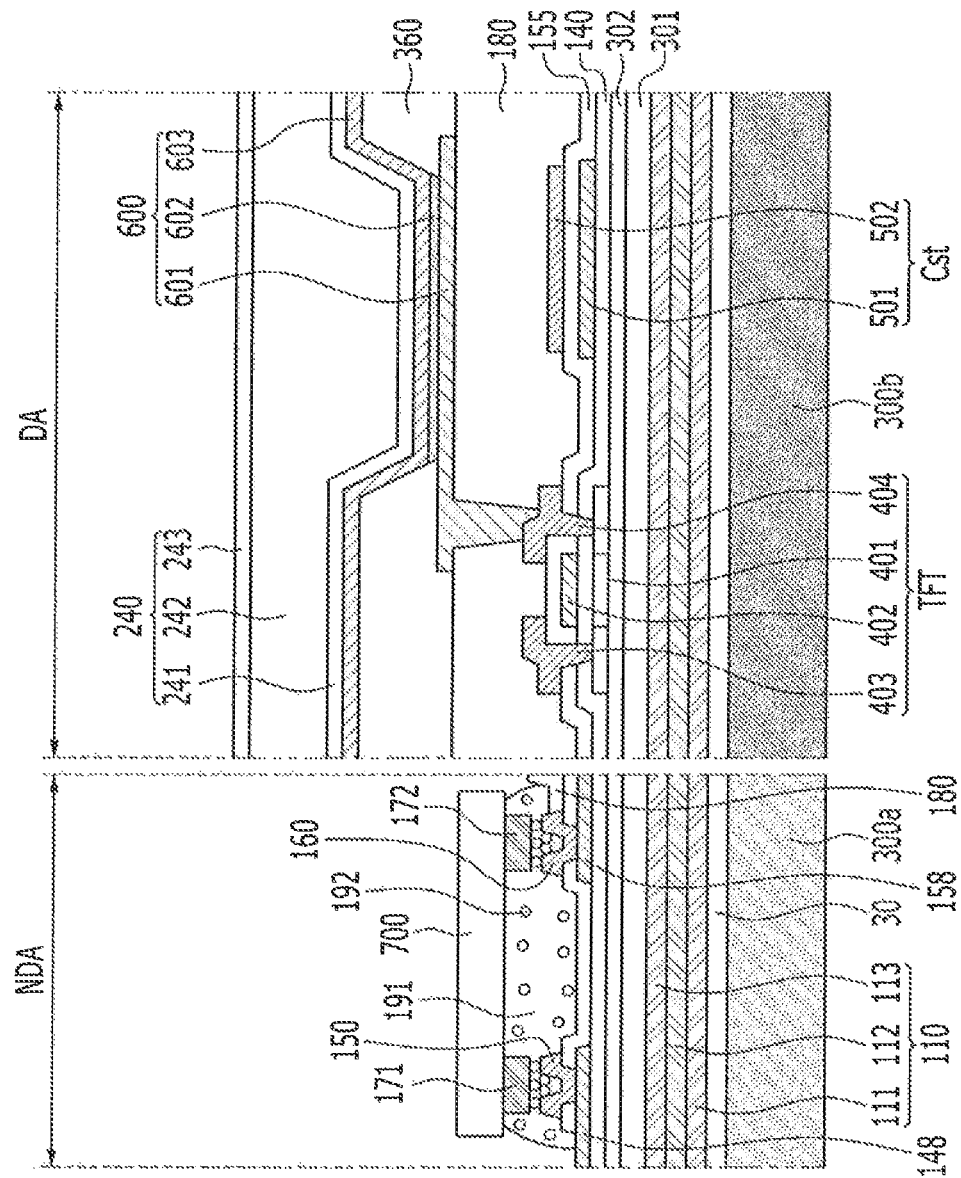
FIG. 14 is a cross-sectional view illustrating comparison of a display area and a non-display area according to the exemplary embodiment of FIG. 1.

FIG. 14 is a cross-sectional view illustrating comparison of a display area and a non-display area according to the exemplary embodiment of FIG. 1.

Referring to FIG. 14, a barrier layer 301 is disposed on the substrate 110. The substrate 110 may be a flexible substrate, and the adhesive layer 30 and the first and second protection films 300a and 300b are disposed in one surface of the substrate 110 facing downward. A thickness of the first and second protection film 300a and 300b may be larger than that of the substrate 110. The substrate 110 may be formed of a single organic material, or may be formed to have a stacked structure including an organic material layer and an inorganic material layer.

For example, the substrate 110 may be formed to have a stacked structure including a first layer 111 formed of an organic material such as polyimide, a second layer 112 formed of an inorganic material such as a silicon oxide or a silicon nitride, and a third layer 113 formed of the same material as the first layer 111. The flexible substrate having a stacked structure may have low oxygen transmittance, low moisture transmittance, and high durability compared with a flexible substrate formed of a single organic material.

The barrier layer 301 serves to block penetration of moisture and oxygen through the substrate 110, and may be formed of multiple layers in which a silicon oxide and a silicon nitride are alternately and repeatedly stacked. A buffer layer 302 may be disposed on the barrier layer 301. The buffer layer 302 serves to provide a flat surface for forming a pixel circuit thereupon, and may include a silicon oxide or a silicon nitride.

A semiconductor layer 401 is formed on the buffer layer 302. The semiconductor layer 401 may be formed of polysilicon or an oxide semiconductor, and the semiconductor layer formed of an oxide semiconductor may be covered with an additional protection film. The semiconductor layer 401 includes a channel region, which is not doped with an impurity. The semiconductor layer 401 further includes a source region and a drain region, which are disposed at opposite sides of the channel region, and are doped with an impurity.

The gate insulating layer 140 is disposed on the semiconductor layer 401. The gate insulating layer 140 may be formed as a single layer and may include silicon oxide or a silicon nitride. The gate insulation layer 140 may alternatively be formed as a stack of multiple layers. A gate electrode 402 and a first capacitor plate 501 are disposed on the gate insulating layer 140. The gate electrode 402 overlaps with a channel region of the semiconductor layer 401. Each of the gate electrode 402 and the first capacitor plate 501 may include Au, Ag, Cu, Ni, Pt, Pd, Al, or Mo.

The interlayer insulating layer 155 is formed on the gate electrode 402 and the first capacitor plate 501, and a source electrode 403, a drain electrode 404, and a second capacitor plate 502 are formed on the interlayer insulating layer 155. The interlayer insulating layer 304 may be formed as a single layer and may include silicon oxide or a silicon nitride. The interlayer insulating layer 304 may alternatively include multiple stacked layers.

The source electrode 403 and the drain electrode 404 are respectively connected with a source region and a drain region of the semiconductor layer 401 through contact holes formed in the interlayer insulating layer 155 and the gate insulating layer 140. The second capacitor plate 502 is overlapped with the first capacitor plate 501. The first capacitor plate 501 and the second capacitor plate 502 may, together, form a storage capacitor Cst with the interlayer insulating layer 155 as a dielectric material. The source electrode 403, the drain electrode 404, and the second capacitor plate 502 may be formed as multiple metal layers of titanium, aluminum, and titanium.

In FIG. 14, a top-gate type driving thin film transistor TFT is shown, however, it is to be understood that the structure of the driving thin film transistor is not limited to the example shown in FIG. 14. A pixel circuit includes a switching thin film transistor, the driving thin film transistor TFT, and a storage capacitor Cst. However, for convenience of illustration, the switching thin film transistor is omitted in FIG. 14.

The first and second input pad layers 148 and 150 and the first and second output pad layers 158 and 160 are disposed in the non-display area NDA of the substrate 110. The first input pad layer 148 and the first output pad layer 158 may be formed of the same material as that of the gate electrode 402, and the second input pad layer 150 and the second output pad layer 160 may be formed of the same material as that of the source and drain electrodes 403 and 404.

The driving thin film transistor TFT is covered with a planarization layer 180, and is connected with an organic light emitting diode 600 so that the driving thin film transistor TFT can drive the organic light emitting diode 600. The planarization layer 180 may include an organic insulator or an inorganic insulator, and may be configured in a complex form including an organic insulator and an inorganic insulator. The organic light emitting diode 600 includes a pixel electrode 601, an emission layer 602, and a common electrode 603. The planarization layer 180 may be formed together with the second passivation layer 180 of the non-display area NDA by using a same material.

The pixel electrode 601 is separately formed in each pixel on the planarization layer 181, and is connected to the drain electrode 404 of the driving thin film transistor TFT through a via hole formed on the planarization layer 180. A pixel definition layer 360 is disposed on the planarization layer 180 and an edge of the pixel electrode 601. The emission layer 602 is disposed on the pixel electrode 601. The common electrode 603 is entirely disposed on the display area DA.

One of the pixel electrode 601 and the common electrode 603 injects holes into the emission layer 602, and the other one injects electrons into the emission layer 602. The electrons and holes combine with each other within the emission layer 602 to generate excitons, and light is emitted by energy generated when the excitons fall from an excited state to a ground state.

The pixel electrode 601 may be formed of a reflective layer, and the common electrode 603 may be formed of a transparent layer or a transflective layer. Light emitted from the emission layer 602 is reflected by the pixel electrode 601, and passes through the common electrode 603 where the light may then contribute to the displayed image. When the common electrode 603 is formed of a transflective layer, some of the light reflected by the pixel electrode 601 is re-reflected by the common electrode 603 to form a resonance structure, thereby increasing the light-extracting efficiency.

The organic light emitting diode 600 is covered with the encapsulation layer 240. The encapsulation layer 240 seals the organic light emitting diode 600 so as to protect the organic light emitting diode 600 from moisture and oxygen included in outside air. The encapsulation layer 240 may be formed in a stacked structure of an inorganic layer and an organic layer. For example, the encapsulation layer 240 may include a first inorganic layer 241, an organic layer 242, and a second inorganic layer 243.

Figure 15:
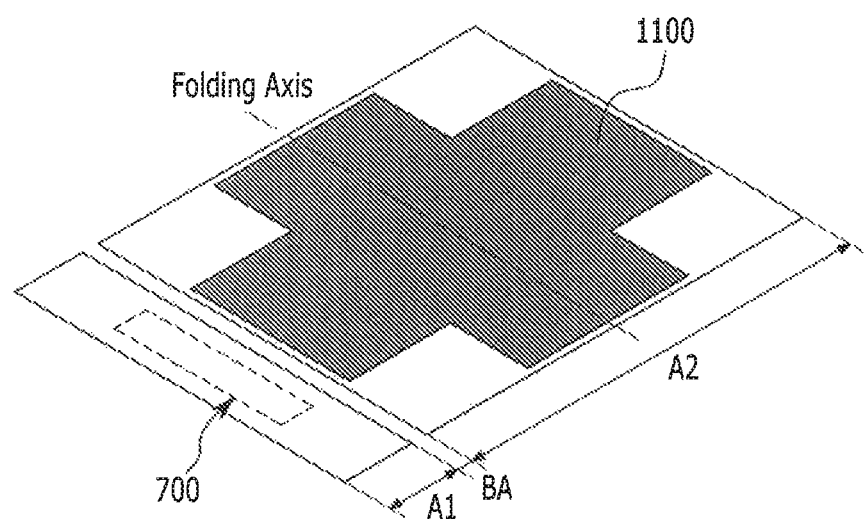
FIG. 15 is a schematic perspective view illustrating a display device including a light-blocking region according to an exemplary embodiment of the present disclosure.

FIG. 15 is a schematic perspective view illustrating a display device including light-blocking region according to an exemplary embodiment of the disclosure.

Referring to FIG. 15, a light-blocking pattern 1100 may be formed in an area of 50% or more of the second region A2, and the light-blocking pattern 1100 may be disposed between the substrate 110 and the adhesive layer 30 shown in FIG. 1. The light-blocking pattern 1100 serves to block outside light.

While this invention has been described in connection with what is presently considered to be practical exemplary embodiments, it is to be understood that the invention is not limited to the disclosed embodiments, but, on the contrary, is intended to cover various modifications and equivalent arrangements.

What is claimed is:
1. A display device comprising:
 a flexible substrate including a display area and a non-display area, the flexible substrate having a first surface and a second surface opposite to the first surface, wherein a thin film transistor is disposed on the second surface;
 a first protection film disposed on the first surface of the flexible substrate, wherein the first protection film is disposed over the non-display area of the flexible substrate; and a second protection film disposed on the first surface of the flexible substrate, wherein the second protection film is disposed over the display area of the flexible substrate, wherein a light transmittance of the first protection film is higher than a light transmittance of the second protection film, wherein the flexible substrate is disposed between the thin film transistor and the first protection film, wherein a maximum distance between the first surface and the first protection film and a maximum distance between the first surface and the second protection film are substantially the same as each other, wherein the first protection film and the second protection film are separated from each other by a space, and the first protection film and the second protection film have different compositions, and wherein a first adhesive layer is disposed between the first protection film and the flexible substrate, and a second adhesive layer is disposed between the second protection film and the flexible substrate.

2. The display device of claim 1, wherein the first adhesive layer and the second adhesive layer have different degrees of adhesion.

3. The display device of claim 1, wherein the first adhesive layer and the second adhesive layer have different storage modulus.

4. The display device of claim 1, further comprising a cushion layer disposed between the first adhesive layer and the second adhesive layer.

5. The display device of claim 4, wherein the cushion layer includes at least one of polyethylene terephthalate (PET), polycarbonate (PC), polymethyl methacrylate (PMMA), polyethylene naphthalate (PEN), polyimide (PD, and polyethylene sulfide (PES).

6. The display device of claim 1, further comprising a driving integrated circuit chip disposed on the second surface of the flexible substrate and in the non-display area, wherein the driving integrated circuit chip is mounted on the flexible substrate.

7. The display device of claim 1, wherein a color of the first protection film is different from that of the second protection film.

8. The display device of claim 1, further comprising a neutral plane adjusting member disposed on the second surface of the flexible substrate, wherein the neutral plane adjusting member overlaps with a space that separates the first protection film from the second protection film.

9. The display device of claim 1, wherein a light transmittance of the first protection film is 80% or more, and a light transmittance of the second protection film is 60% or less.

10. The display device of claim 1, wherein a tensile modulus of the first protection film is in a range of 3 GPa to 15 GPa, a tensile modulus of the second protection film is in a range of 2 GPa to 10 GPa, and the tensile modulus of the first protection film is larger than that of the second protection film.

11. The display device of claim 1, wherein a glass transition temperature Tg ref the first protection film is 100° C. or less, and a glass transition temperature Tg of the second protection film is 150° C. or more.

12. The display device of claim 1, wherein the first protection film includes at least one of polyethylene terephthalate (PET), polycarbonate (PC), and polymethyl methacrylate (PMMA).

13. The display, device of claim 12, wherein the second protection film includes at least one of polyethylene naphthalate (PEN), polyimide (Pt), polyethylene sulfide (PES), polyimide (PA), and aramid.

14. The display device of claim 1, wherein the flexible substrate further includes a bending area and a space that separates the first protection film from the second protection film is disposed in the bending area.

15. The display device of claim 14, wherein at least one of end portions of the first protection film and the second protection film adjacent to the bending area has an arc shape.

16. The display device of claim 14, further comprising: a neutral plane adjusting member disposed on the second surface of the flexible substrate; the first adhesive layer disposed between the first protection film and the flexible substrate and the second adhesive layer disposed between the second protection film and the flexible substrate; and a supporting member disposed on the first adhesive layer and second adhesive layer, wherein the supporting member is aligned with the neutral plane adjusting member.

17. The display device of claim 1, wherein the flexible substrate further includes a folding portion that crosses the display area.

18. A display device comprising:
a substrate including a display area and a non-display area;
a first protection film disposed in the non-display area of the substrate;
a second protection film disposed in the display area of the substrate;
a first adhesive layer disposed between the first protection film and the substrate; and
a second adhesive layer disposed between the second protection film and the substrate,
wherein the first adhesive layer and the second adhesive layer have different storage modulus,
wherein a storage modulus of the first adhesive layer is larger than that of the second adhesive layer, and
wherein the first protection film and the second protection film are commonly disposed on a single layer of the display device, do not overlap in a thickness direction of the display device, are separated from each other by a space along a lengthwise direction of extension of the substrate, and the first protection film and the second protection film line different compositions.

19. The display device of claim 18, wherein light transmittance of the first protection film is higher than that of the second protection film.

20. The display device of claim 18, wherein a degree of adhesion of the first adhesive layer is larger than that of the second adhesive layer.

21. The display device of claim 18, further comprising a driving integrated circuit chip disposed in the non-display area, wherein the driving integrated circuit chip is mounted on the substrate.

22. The display device of claim 18, further comprising a neutral plane adjusting member disposed on the substrate, wherein the neutral plane adjusting member is overlapped with a space that separates the first protection film from the second protection film.

23. The display device of claim 18, wherein the substrate further includes a bending area overlapping a space that separates the first protection film from the second protection film.

24. The display device of claim 18, wherein the substrate further includes a folding portion that crosses the display area.

25. A display device comprising:
a flexible substrate including a display area and a non-display area, the flexible substrate having a first surface and a second surface opposite to the first surface, wherein a thin film transistor is disposed on the second surface;
a first protection film disposed on the first surface of the flexible substrate, wherein the first protection film is disposed over the non-display area of the flexible substrate; and
a second protection film disposed on the first surface of the flexible substrate, wherein the second protection film is disposed over the display area of the flexible substrate,
wherein a light transmittance of the first protection film is higher than a light transmittance of the second protection film,
wherein the first protection film and the second protection film have different compositions,
wherein the flexible substrate is disposed between the thin film transistor and the first protection film,
wherein the thin film transistor is disposed on the second surface and electrically connected to an organic light emitting diode, and
wherein a first adhesive layer is disposed between the first protection film and the flexible substrate, and a second adhesive layer disposed between the second protection film and the flexible substrate.

* * * * *